(12) United States Patent
Ichitsubo et al.

(10) Patent No.: US 7,769,355 B2
(45) Date of Patent: Aug. 3, 2010

(54) SYSTEM-IN-PACKAGE WIRELESS COMMUNICATION DEVICE COMPRISING PREPACKAGED POWER AMPLIFIER

(75) Inventors: Ikuroh Ichitsubo, Kanagawa Prefecture (JP); Kanya Kubota, Shiga-ken (JP); Wen Chung Liu, Chung Li (TW)

(73) Assignee: Micro Mobio Corporation, Palo Alto, CA (US)

( * ) Notice: Subject to any disclaimer, the term of this patent is extended or adjusted under 35 U.S.C. 154(b) by 585 days.

(21) Appl. No.: 11/152,308

(22) Filed: Jun. 14, 2005

(65) Prior Publication Data

US 2006/0160504 A1    Jul. 20, 2006

Related U.S. Application Data

(63) Continuation-in-part of application No. 11/039,162, filed on Jan. 19, 2005, now Pat. No. 7,123,088.

(51) Int. Cl.
*H01Q 11/12* (2006.01)
*H04B 1/04* (2006.01)

(52) U.S. Cl. ............... 455/127.1; 455/127.2; 455/90.3; 455/128; 455/126; 330/126; 330/254

(58) Field of Classification Search ............. 455/127.1, 455/127.2, 90.3, 128, 126; 330/126, 254 330/140; 257/692
See application file for complete search history.

(56) References Cited

U.S. PATENT DOCUMENTS

| | | | |
|---|---|---|---|
| 4,590,614 A * | 5/1986 | Erat | ............ 455/270 |
| 4,977,041 A | 12/1990 | Shiozawa | |
| 5,050,238 A | 9/1991 | Tomizuka | |
| 5,164,683 A | 11/1992 | Shields | |
| 5,255,324 A | 10/1993 | Brewer | |
| 5,283,539 A | 2/1994 | Sadhir | |
| 5,548,239 A | 8/1996 | Kohama | |
| 5,608,364 A | 3/1997 | Hirai | |
| 5,625,894 A | 4/1997 | Jou | |
| 5,656,972 A | 8/1997 | Norimatsu | |
| 5,697,087 A | 12/1997 | Miya | |
| 5,732,334 A | 3/1998 | Miyake | |
| 5,825,227 A | 10/1998 | Kohama | |
| 5,880,635 A | 3/1999 | Satoh | |
| 5,969,560 A | 10/1999 | Kohama | |
| 6,025,651 A | 2/2000 | Nam | |
| 6,075,995 A | 6/2000 | Jensen | |

(Continued)

OTHER PUBLICATIONS

U.S. Appl. No. 10/385,059, filed Feb. 7, 2005, Ikuroh Ichitsubo.

(Continued)

*Primary Examiner*—Edward Urban
*Assistant Examiner*—RuiMeng Hu
(74) *Attorney, Agent, or Firm*—Xin Wen (57) ABSTRACT

A substantially rectangular shaped power amplifier module includes a power amplifier for amplifying radio frequency signals, a bias control terminal and a power sensing terminal disposed on the same side of the power amplifier module, an input terminal and a ground terminal disposed on the same side of the power amplifier module, and an output terminal and one or more power supply terminals disposed on the same side of the power amplifier module.

24 Claims, 8 Drawing Sheets

U.S. PATENT DOCUMENTS

| | | | |
|---|---|---|---|
| 6,118,985 | A | 9/2000 | Kawakyu |
| 6,148,220 | A | 11/2000 | Sharp |
| 6,151,509 | A | 11/2000 | Chorey |
| 6,175,279 | B1 | 1/2001 | Ciccarelli |
| 6,183,703 | B1 | 2/2001 | Hsu |
| 6,198,351 | B1 | 3/2001 | Winslow |
| 6,203,587 | B1 | 3/2001 | Lesieur |
| 6,236,366 | B1 * | 5/2001 | Yamamoto et al. .... 343/700 MS |
| 6,262,630 | B1 | 7/2001 | Eriksson |
| 6,265,943 | B1 | 7/2001 | Dening |
| 6,265,954 | B1 | 7/2001 | Krause |
| 6,271,727 | B1 * | 8/2001 | Schmukler ................. 330/284 |
| 6,281,755 | B1 | 8/2001 | Feld |
| 6,281,762 | B1 | 8/2001 | Nakao |
| 6,285,866 | B1 * | 9/2001 | Lee et al. .................... 455/318 |
| 6,294,967 | B1 | 9/2001 | Hirai |
| 6,326,866 | B1 | 12/2001 | Sasaki |
| 6,366,788 | B1 | 4/2002 | Fujioka |
| 6,417,730 | B1 | 7/2002 | Segallis |
| 6,462,622 | B1 | 10/2002 | Mori |
| 6,483,398 | B2 * | 11/2002 | Nagamori et al. ........... 333/116 |
| 6,496,684 | B2 | 12/2002 | Nakao |
| 6,501,945 | B1 * | 12/2002 | Chien ........................ 455/296 |
| 6,518,844 | B1 * | 2/2003 | Sherman et al. ............ 330/286 |
| 6,542,720 | B1 * | 4/2003 | Tandy ........................ 455/90.3 |
| 6,625,050 | B2 | 9/2003 | Suwa |
| 6,630,372 | B2 | 10/2003 | Ball |
| 6,639,466 | B2 | 10/2003 | Johnson |
| 6,677,833 | B2 | 1/2004 | Sheen |
| 6,678,506 | B1 | 1/2004 | Dolman |
| 6,683,512 | B2 | 1/2004 | Nakamata |
| 6,693,498 | B1 | 2/2004 | Sasabata |
| 6,694,129 | B2 | 2/2004 | Peterzell |
| 6,696,903 | B1 | 2/2004 | Kawahara |
| 6,720,850 | B2 | 4/2004 | Sasabata |
| 6,741,125 | B2 * | 5/2004 | Arai et al. ..................... 330/66 |
| 6,762,659 | B2 | 7/2004 | Son |
| 6,774,718 | B2 | 8/2004 | Ichitsubo |
| 6,775,525 | B1 * | 8/2004 | Tanoue et al. ............ 455/127.3 |
| 6,798,287 | B2 * | 9/2004 | Wu et al. .................... 330/129 |
| 6,804,500 | B2 * | 10/2004 | Yamaguchi .............. 455/127.1 |
| 6,816,714 | B2 * | 11/2004 | Toncich ....................... 455/107 |
| 6,822,515 | B2 | 11/2004 | Ichitsubo |
| 6,847,262 | B2 | 1/2005 | Ichitsubo |
| 6,911,942 | B2 | 6/2005 | Fukuda |
| 6,914,482 | B2 | 7/2005 | Ichitsubo |
| 7,016,655 | B2 * | 3/2006 | Vakilian ....................... 455/73 |
| 7,071,783 | B2 | 7/2006 | Ichitsubo |
| 7,088,186 | B2 * | 8/2006 | Sugiura ..................... 330/307 |
| 7,088,964 | B2 * | 8/2006 | O ............................. 455/90.3 |
| 7,110,730 | B2 * | 9/2006 | Okada et al. ............. 455/127.2 |
| 7,116,175 | B2 * | 10/2006 | Shimizu et al. ............ 330/307 |
| 7,119,631 | B2 * | 10/2006 | Castaneda et al. ............ 333/32 |
| 7,123,088 | B2 * | 10/2006 | Ichitsubo et al. ........... 330/129 |
| 7,133,705 | B2 * | 11/2006 | Akatsuka et al. ......... 455/575.1 |
| 7,139,538 | B2 * | 11/2006 | Ono et al. ................ 455/127.1 |
| 7,180,373 | B2 * | 2/2007 | Imai et al. .................. 330/307 |
| 7,408,405 | B2 * | 8/2008 | Ohnishi et al. ................ 330/51 |
| 7,453,147 | B2 * | 11/2008 | Ida et al. ..................... 257/723 |
| 7,580,687 | B2 * | 8/2009 | Ichitsubo et al. ......... 455/127.1 |
| 2001/0029168 | A1 * | 10/2001 | Yamaguchi ................. 455 |
| 2002/0002038 | A1 * | 1/2002 | Seawright et al. ........... 455/127 |
| 2002/0064029 | A1 | 5/2002 | Pohjonen ..................... 361/719 |
| 2003/0027539 | A1 * | 2/2003 | Nagamori et al. ........ 455/234.1 |
| 2004/0075504 | A1 * | 4/2004 | Vintola ....................... 330/298 |
| 2004/0090266 | A1 * | 5/2004 | Sakai et al. ................. 330/129 |
| 2004/0092236 | A1 * | 5/2004 | Irie et al. .................... 455/118 |
| 2004/0203552 | A1 | 10/2004 | Horiuchi et al. |
| 2004/0219887 | A1 * | 11/2004 | Vakilian ....................... 455/73 |
| 2004/0224649 | A1 * | 11/2004 | Shamsaifar ................. 455/107 |
| 2004/0229579 | A1 * | 11/2004 | Tsutsui et al. ............ 455/127.2 |
| 2004/0248529 | A1 * | 12/2004 | Park ........................ 455/127.1 |
| 2005/0009484 | A1 * | 1/2005 | Imai et al. ................... 455/144 |
| 2005/0026647 | A1 * | 2/2005 | Li et al. ..................... 455/552.1 |
| 2005/0030107 | A1 * | 2/2005 | Shimizu et al. ............. 330/307 |
| 2005/0042994 | A1 * | 2/2005 | Otaka et al. .............. 455/180.3 |
| 2005/0077964 | A1 * | 4/2005 | Maeda ....................... 330/285 |
| 2005/0085200 | A1 * | 4/2005 | Toncich ...................... 455/121 |
| 2005/0099228 | A1 * | 5/2005 | Akatsuka et al. .............. 330/66 |
| 2005/0113035 | A1 * | 5/2005 | Kyongyop O .............. 455/90.3 |
| 2005/0127994 | A1 * | 6/2005 | Chu ........................... 330/140 |
| 2005/0136865 | A1 * | 6/2005 | Dupuis ..................... 455/127.1 |
| 2005/0136879 | A1 * | 6/2005 | Khorram .................... 455/333 |
| 2005/0146379 | A1 * | 7/2005 | Sugiyama et al. ........... 330/133 |
| 2005/0174874 | A1 * | 8/2005 | Sugiura ................... 365/230.06 |
| 2005/0176380 | A1 * | 8/2005 | Okabe et al. .................. 455/73 |
| 2005/0179498 | A1 | 8/2005 | Tsutsui et al. |
| 2005/0239415 | A1 | 10/2005 | Sagae et al. |
| 2005/0245212 | A1 * | 11/2005 | Ono et al. ................. 455/127.1 |
| 2005/0258452 | A1 * | 11/2005 | Konishi et al. ............... 257/197 |
| 2005/0280471 | A1 * | 12/2005 | Matsushita et al. ......... 330/289 |
| 2006/0009171 | A1 * | 1/2006 | Xu et al. .................. 455/114.2 |
| 2006/0019621 | A1 * | 1/2006 | Yamaguchi .............. 455/127.1 |
| 2006/0025102 | A1 * | 2/2006 | Kipnis et al. ................ 455/333 |
| 2006/0084392 | A1 * | 4/2006 | Marholev et al. ............. 455/78 |
| 2006/0118970 | A1 * | 6/2006 | Ida et al. ..................... 257/782 |
| 2006/0139089 | A1 * | 6/2006 | Bambridge et al. ........... 330/65 |
| 2006/0160505 | A1 * | 7/2006 | Ichitsubo et al. ......... 455/127.1 |
| 2006/0164188 | A1 | 7/2006 | Yamada |
| 2006/0178122 | A1 * | 8/2006 | Srinivasan et al. ........ 455/168.1 |
| 2006/0261460 | A1 * | 11/2006 | Sato et al. ................... 257/685 |
| 2006/0290431 | A1 * | 12/2006 | Shimizu et al. ............. 330/307 |
| 2006/0293001 | A1 * | 12/2006 | Okada et al. ............. 455/127.1 |
| 2007/0010285 | A1 * | 1/2007 | Schmidt ................... 455/553.1 |
| 2007/0023897 | A1 * | 2/2007 | Nakajima et al. ........... 257/728 |
| 2007/0066243 | A1 * | 3/2007 | Yamauchi et al. ............. 455/78 |
| 2007/0115054 | A1 * | 5/2007 | Ichitsubo et al. ............ 330/126 |
| 2007/0207748 | A1 * | 9/2007 | Toncich ...................... 455/107 |
| 2008/0068086 | A1 * | 3/2008 | Tsurumaki et al. .......... 330/277 |
| 2008/0146187 | A1 * | 6/2008 | Danno et al. ............... 455/333 |
| 2008/0164947 | A1 * | 7/2008 | Shimizu et al. ............. 330/277 |

OTHER PUBLICATIONS

U.S. Appl. No. 10/804,737, filed Mar. 18, 2004, Ikuroh Ichitsubo.
U.S. Appl. No. 10/843,409, filed May 10, 2004, Ikuroh Ichitsubo.
U.S. Appl. No. 10/919,850, filed Aug. 16, 2004, Shinsuke Inui.
U.S. Appl. No. 10/938,779, filed Sep. 10, 2004, Ikuroh Ichitsubo.
U.S. Appl. No. 10/972,636, filed Oct. 24, 2004, Kanya Kubota.
U.S. Appl. No. 11/039,687, filed Jan. 19, 2005, Ikuroh Ichitsubo.
U.S. Appl. No. 11/064,261, filed Feb. 24, 2005, Ikuroh Ichitsubo.
U.S. Appl. No. 11/110,249, filed Apr. 20, 2005, Ikuroh Ichitsubo.
U.S. Appl. No. 11/121,288, filed May 2, 2005, Ikuroh Ichitsubo.
U.S. Appl. No. 11/126,667, filed May 11, 2005, Ikuroh Ichitsubo.
U.S. Appl. No. 11/152,308, filed Jun. 14, 2005, Ikuroh Ichitsubo.
U.S. Appl. No. 11/173,741, filed Jul. 2, 2005, Ikuroh Ichitsubo.
U.S. Appl. No. 11/173,965, filed Jul. 2, 2005, Ikuroh Ichitsubo.
U.S. Appl. No. 11/173,968, filed Jul. 2, 2005, Ikuroh Ichitsubo.
U.S. Appl. No. 11/323,763, filed Dec. 30, 2005, Ikuroh Ichitsubo.
U.S. Appl. No. 11/323,788, filed Dec. 30, 2005, Ikuroh Ichitsubo.
U.S. Appl. No. 11/433,896, filed May 12, 2008, Ikuroh Ichitsubo.
U.S. Appl. No. 11/486,465, filed Jul. 14, 2006, Ikuroh Ichitsubo.

* cited by examiner

SYSTEM-IN-PACKAGE WIRELESS COMMUNICATION DEVICE COMPRISING PREPACKAGED POWER AMPLIFIER

RELATED APPLICATION

The present invention is a Continuation-in-Part to U.S. patent application Ser. No. 11/039,162, titled "Power amplifier module for wireless communication devices" by Ichitsubo et al, filed Jan. 19, 2005, now U.S. Pat. No. 7,123,088. The present invention is related to the commonly assigned U.S. patent application Ser. No. 10/041,863, titled "Multilayer RF amplifier module" by Wang, et al., filed Oct. 22, 2001, U.S. patent application Ser. No. 10/385,058, titled "Power amplifier module for wireless communication devices" by Ichitsubo et al, filed Mar. 9, 2003, U.S. patent application Ser. No. 10/385,059, titled "Accurate power sensing circuit for power amplifiers" by Ichitsubo et al, filed Mar. 9, 2003, U.S. patent application Ser. No. 10/804,737, titled "RF front-end module for wireless communication devices" by Ichitsubo et al., filed Mar. 18, 2004, U.S. patent application Ser. No. 10/972,858, titled "Frequency filtering circuit for wireless communication devices" by Kubota et al, filed Oct. 25, 2004, U.S. patent application Ser. No. 10/972,636, titled "Diplexer circuit for wireless communication devices" by Kubota et al, filed Oct. 25, 2004, U.S. patent application Ser. No. 11/039,687, titled "Multi-band power amplifier module for wireless communications" by Ichitsubo et al, filed Jan. 19, 2005, and U.S. Patent Application titled "Multi-mode power amplifier module for wireless communication devices" by Ichitsubo et al, filed Apr. 20, 2005. The disclosures of these related applications are hereby incorporated by reference.

BACKGROUND

The present invention relates to radio frequency (RF) power amplifiers (PA) module. Portable devices such as laptop personal computers, Personal Digital Assistant and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

One important requirement for the state-of-the-art wireless devices is to provide power amplification in a plurality of frequency bands and a plurality of communication standards with different digital modulation method. The quality and power level of the amplified RF signals need to be properly controlled. For example, for high data rate wireless applications, the output signals is required to be linear over a wide signal power range in each of the plurality of frequency bands. Preferably the amplification is reduced or increased according to input RF signal, transmittance range and data rate so that power consumption can be optimized.

Wireless communication devices are also used to receive and transmit signals under different standards, protocols and frequency bands. Various standards and protocols can specify a wide range of wireless applications spanning from mobile devices, information technologies to consumer electronics. Providing users wireless communication capabilities under different standards, protocols and frequency bands has been a challenge to the wireless equipment and in particular RF power amplifiers.

A constant challenge to the manufacturing of wireless communication devices is to increase yield and reduce product loss. The yields of wireless communication devices are affected by the performance of its key components such as base band processor, RF transceiver, and power amplifier. The costs and manufacture cycle are significantly influenced by the manufacture yield.

SUMMARY

In one aspect, the present application relates to a substantially rectangular shaped power amplifier module, comprising:

a power amplifier configured to receive an input radio frequency signal to produce an amplified radio frequency signal in response to a bias control signal;

a bias control terminal configured to receive the bias control signal;

a power sensing terminal configured to output a power sensing signal in response to the amplified radio frequency signal, wherein the bias control terminal and the power sensing terminal are disposed on the same side of the substantially rectangular shaped power amplifier module;

an input terminal configured to receive the input radio frequency signal;

a ground terminal electrically connected to the ground of the power amplifier, wherein the input terminal and the ground terminal are disposed on the same side of the substantially rectangular shaped power amplifier module;

an output terminal configured to output the amplified radio frequency signal; and one or more power supply terminal configured to receive power to be supplied to the power amplifier, wherein the output terminal and the one or more power supply terminals are disposed on the same side of the substantially rectangular shaped power amplifier module.

In another aspect, the present application relates to a wireless communication device, comprising:

a transceiver configured to convert an input electric signal to a radio frequency signal, and a prepackaged power amplifier configured to produce an amplified radio frequency signal in response to the radio frequency signal;

wherein the prepackaged power amplifier has been tested to be capable of amplifying radio-frequency signals before the prepackaged power amplifier is electrically connected with the transceiver.

In yet another aspect, the present application relates to a wireless communication device, comprising:

a base-band processor configured to digitally process an input electric signal to produce a processed electric signal;

a transceiver configured to convert the processed electric signal to a radio frequency signal;

a prepackaged power amplifier configured to receive the radio frequency signal to produce an amplified radio frequency signal, wherein the prepackaged power amplifier comprises an impedance matching circuit to receive the radio frequency signal and one or more electric terminals to receive power supply, to receive a bias-control signal, or to output a power-sensing signal;

an antenna configured to produce a wireless signal in response to the amplified radio frequency signal; and a substrate configured to electrically connect to the one or more electric terminals in the prepackaged power amplifier to permit the prepackaged power amplifier to be electrically connected to the antenna, the transceiver, and the base band processor, wherein the prepackaged power amplifier has been tested to be capable of amplifying radio-frequency signals before the prepackaged power amplifier is electrically connected with the substrate.

An advantage of the present invention is the significantly increased manufacture yields of wireless communication devices. Manufacture throughput is increased. Manufacture cost is reduced.

In another aspect, the wireless communication device is packaged device that comprises a prepackaged power amplifier module. The wireless communication device is a Package in Package (PiP) or a System in Package (SIP). The prepackaged power amplifier module can include impedance matching circuits for input and output RF signals and electric terminals for power supply, biasing control, and power sensing. The prepackaged power amplifier module can be fully tested using RF signals using operating power supply before it is packaged in the wireless communication device. The non-operational prepackaged power amplifiers can be discarded. Only the functional prepackaged power amplifiers are mounted in the wireless communication devices. The product loss due to non-operation tested power amplifier is drastically reduced.

In yet another aspect, the wireless communication device comprises a substrate for integrating the prepackaged power amplifier module. The substrate can include a multiplayer printed circuit board (PCB), a lead frame, and lower-temperature co-fired ceramics (LTCC), which include electric interconnects matched to the prepackaged power amplifier module. The prepackaged power amplifier module can be plugged and readily soldered to the substrate.

The prepackaged amplifier module is compact having smaller foot print and thin thickness comparing to prior art implementations. The disclosed apparatus and methods are applicable to cellular wireless communication standards such as 2G, 2.5G and 3G cellular including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., Wi-Fi wireless communication standards such as IEEE 802.11, and Wi-Max wireless communication standards such as IEEE 806.16, and others.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The PA module provides a unitary component that may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components.

Figure 1:
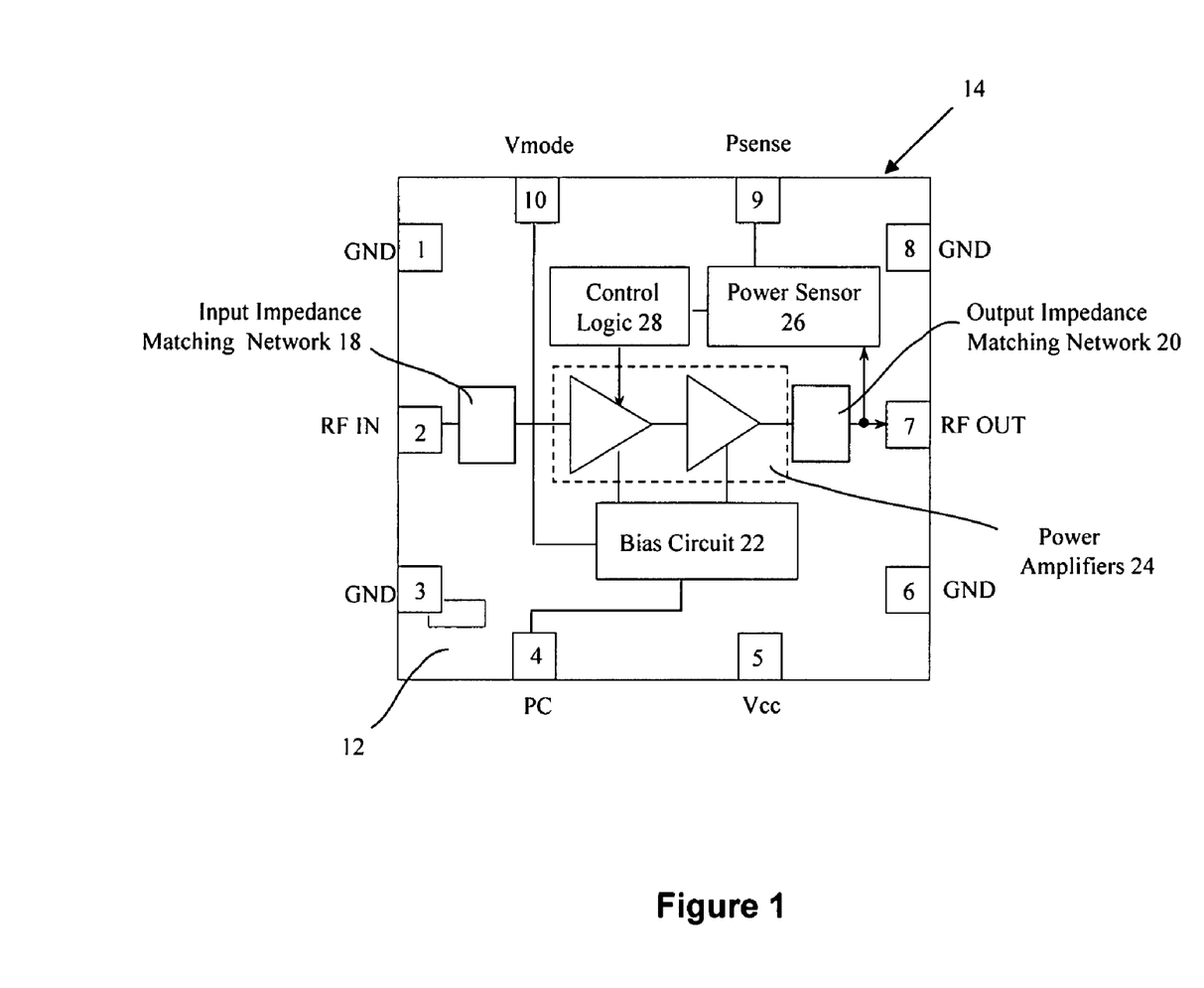
FIG. 1 is a system diagram of the power amplifier module for wireless communications in accordance to the present invention.

FIG. 1 shows a system diagram of the radio frequency PA module 14 for wireless communications in accordance to an embodiment of the present invention. The PA module is built on a substrate 12, which can be a multiplayer printed circuit board (PCB), lead frame, lower-temperature co-fired ceramics (LTCC), or other suitable electronic materials. The substrate includes metal Pins adapted to receive connecting terminals of integrated circuits including the Power Amplifiers 24, the Bias Circuit 22, the Power Sensor 26, and optionally Control Logic 28. The Power Amplifiers 24, the Power Sensor 26, the Bias Circuit 22, can be fabricated in an integrated circuit on a semiconductor chip. The Power Amplifiers 24 can be of one or multiple stages. In the particular example shown in FIG. 1, two sequentially connected stages of power transistors are employed. The amplifier IC chip has an electrically conductive metal layer to be bonded to the top metal layer of the module.

The PA module 14 can also include, in accordance with another feature of the present invention, input impedance matching circuit 18 and output impedance matching circuit 20. The input and output impedance matching networks are preferably based on the 50-ohm standard of the RF industry. Details of impedance matching circuits are described in the above referenced and commonly assigned U.S. patent application Ser. No. 10/041,863, filed Oct. 22, 2001, titled "Multilayer RF amplifier module" by Wang, et al.

The Bias Circuit 22 is used to bias individual stage with suitable current so the amplifiers can operate with minimal signal distortion. The Bias Circuit receives input from the power control signal from the PC port (Pin 4) and can be selected to operate at different settings of idle current using the Vmode port (Pin 10). In accordance with the present invention, the mode control signal and the power-control signal may be dependent at least partially on the power-sensing signal output from the Power Sensor circuit 26.

The PA module is integrated with a Power Sensor circuit 26 that senses the level of the output power. Details of the power sensor circuit are disclosed in the above referenced and commonly assigned U.S. Patent Application "Accurate Power Sensing Circuit for Power Amplifiers" by Ichitsubo et al., the disclosure of which related application is incorporated herein by reference.

A power amplifier with good linearity generally must maintain a constant amplification factor, known as "Gain", which is defined as the ratio of the output signal power level to the input signal power level. However, at high output power level, the power amplifier can be driven close to saturation and a constant gain becomes difficult to maintain. As a result, the quality of digital communication, commonly measured by Error Vector Magnitude (EVM), Bit Error Rate (BER), or Packet Error Rate (PER), degrades at high output power level.

The Power Sensor 26 receives the amplified radio frequency signal from Power Amplifiers 24 and to output a power-sensing control signal. The Control Logic 28 receives and processes the power-sensing control signal, and outputs a processed power-sensing control signal to control Power Amplifiers 24. The processed power-sensing control signal is a function of a quality or a magnitude of the amplified radio frequency signal. For example, the Control Logic 28 improves the linearity performance of power amplifier using the Power Sensor 26 feedback internally. By adjusting the bias of the amplifier depending on the actual output power measured by the Power Sensor 26, it reduces the tendency of saturation and maintains a more constant gain. Thus the linearity of the amplification over a wide range of power is improved. Yet another method of improving the quality of digital communication is to use an external controller to adjust the input RF signal based the known relationship of digital communication quality to output power level.

The PA module 14 shown in FIG. 1 can be used in a wide range wireless communication devices such as cellular phone, mobile computers, and handheld wireless digital devices. The PA module has a miniature size of a few millimeters.

Figure 2:
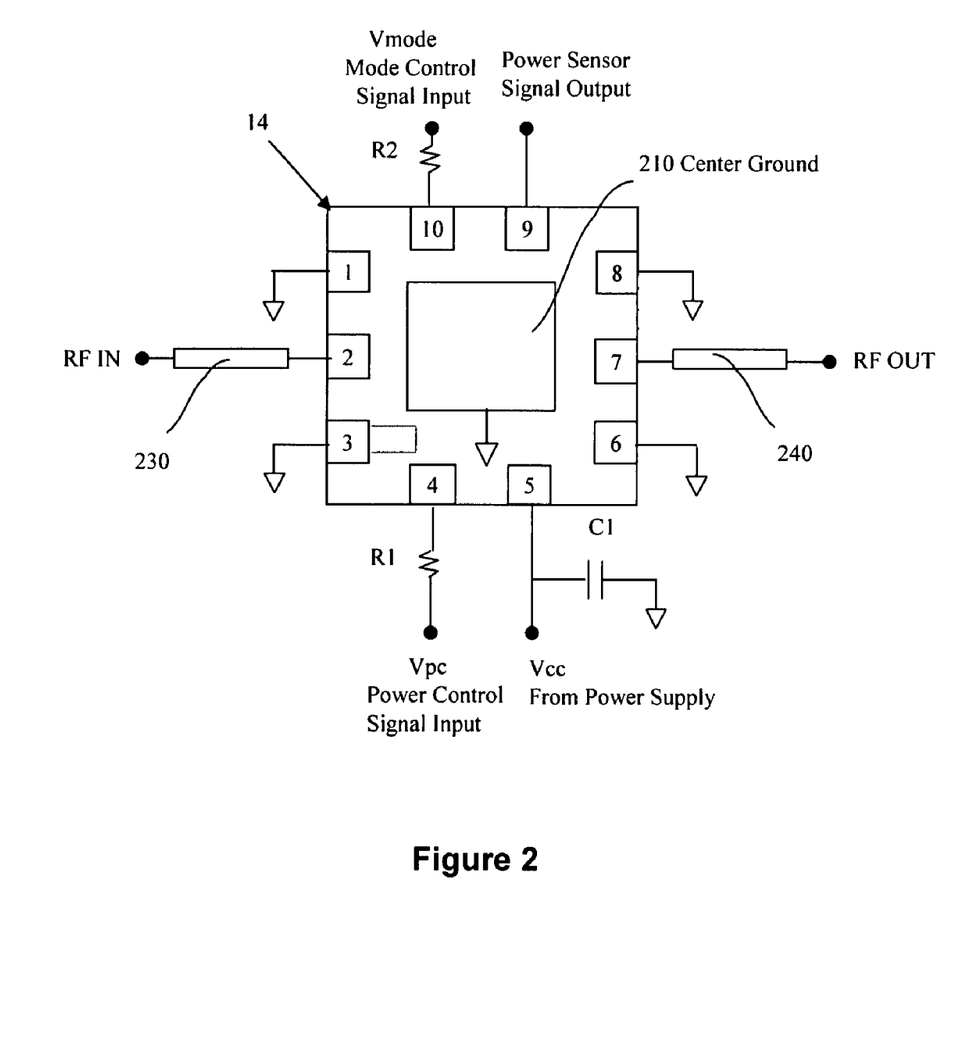
FIG. 2 is the electrical schematics for the application of the power amplifier module shown in FIG. 1 in accordance to an embodiment of the present invention.

FIG. 2 is the electrical schematics illustrating the application of the PA module 14, as shown in FIG. 1, to wireless communications in accordance to the present invention. The PA module has a plurality of metal Pins, namely, Pin 1 through 10 and the Center Ground 210. Pin 1, 3, 6 and 8 are adapted to be connected to the electric ground. Pin 2 (RF IN port) is connected through a 50-ohm transmission line 230 to an RF input signal to be supplied to the Power Amplifiers 24. The output of the power amplifier chip 24 is at Pin 7 (RF OUT port), also connected by a 50-ohm transmission line 240 to the antenna stage, possibly with a filter and transmit/receive switch in between. Pin 4 (PC port) receives a power control signal, while Pin 5 (Vcc port) receives DC power supply. Pin 9 (Psense port) provides a power sensing signal output, while Pin 10 (Vmode port) optimally receives a mode control signal. A series resistor $R_2$ can be used to set the DC voltage to Vmode advantageously depending on the requirement of linear power output or the characteristics varying RF signal.

Typically, the power supply comes from a regulated voltage source to the Vcc port. The PA can be switched ON/OFF by presenting a high and low signal at the PC port. The voltage of high signal the PC port may be optimally adjusted with an external resistor R1. When it is switched to the OFF state, the bias to the power amplifier is shut off and the current consumption is reduced to very small. Thus, the PC port is also commonly referred as "PA_ON", or "PA_ENABLE", etc.

In one embodiment, the input impedance matching network 18, the output impedance matching network 20, the power amplifiers 24, the bias circuit 22 and the power sensor 26 are integrated on an integrated circuit (IC). The IC includes top terminals or bonding pins, which provide various input and output connections to the internal components of the chip. The top terminals are electrically joined to one or more of the plates in the substrate 12. In the preferred embodiment, the chip includes Gallium Arsenide Heterojunction Bipolar Transistors (GaAs HBT). However, other semiconductor materials may also be used.

Figure 3:
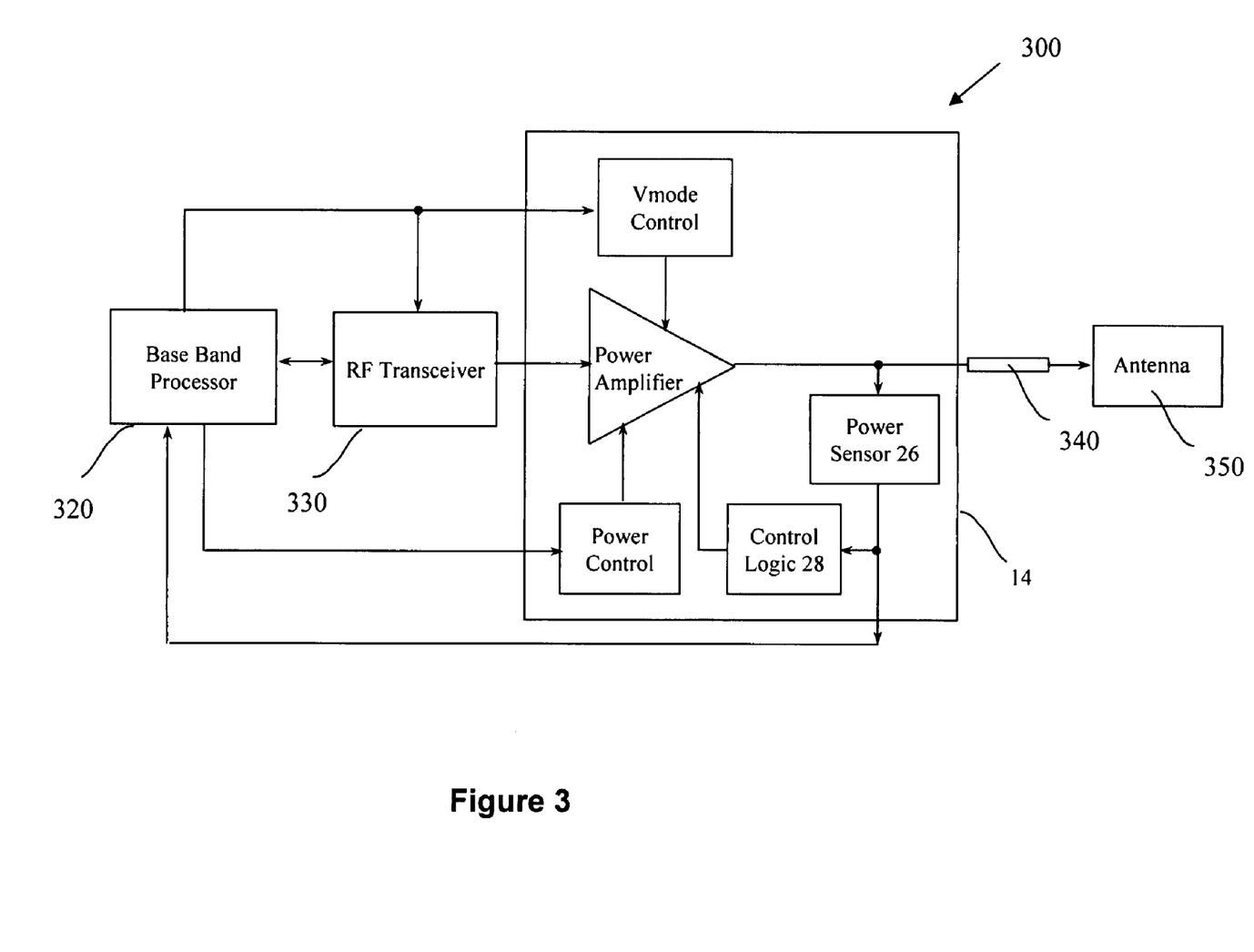
FIG. 3 illustrates the use of the power amplifier module for wireless communications in accordance to an embodiment of the present invention.

FIG. 3 illustrates an exemplary use of the radio frequency PA module for digital wireless communications in accordance to the present invention. The wireless communication device 300 can be a PDA, a WLAN adaptor, or a cellular phone. The wireless communication device 300 includes a base band processor core 320, RF transceivers 330, PA module 14, and a 50-ohm impedance transmission line or micro strip 340 connected to antenna 350.

A base band chip generates digitally modulated signals. The frequency is up-converted by a RF transceiver to a RF frequency band suitable for transmitting. The RF signal is amplified by the PA module 14 for transmission by the antenna. The PA module can be turned ON/OFF by the power control signal. The Vmode control (Pin 10) is used to control and internal settings of the bias circuits by the base band processor 320, which has the knowledge of the digital signal modulation type and the linear output requirement. For example, when the device is transmitting high power, the Vmode control pin set the power amplifier operating in high current to minimize output distortion. When the device needs to transmit low power, the Vmode control pin 10 sets the power amplifier with low current to conserve battery life.

The Power Sensor 26 measures the output RF power, which can be advantageously used externally to the PA module. For example, the output of power sensor can be used by the base band processor 320 to set the transmitting power level for the wireless device by varying the RF input signal to PA module.

Figure 4A:
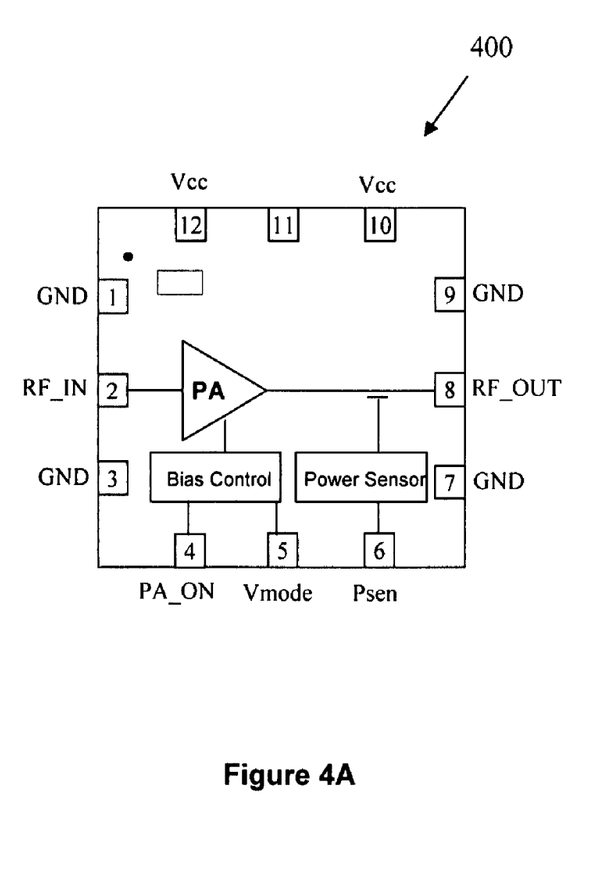
FIG. 4A illustrates the electrical schematics of a single-band power amplifier module.
Figure 4B:
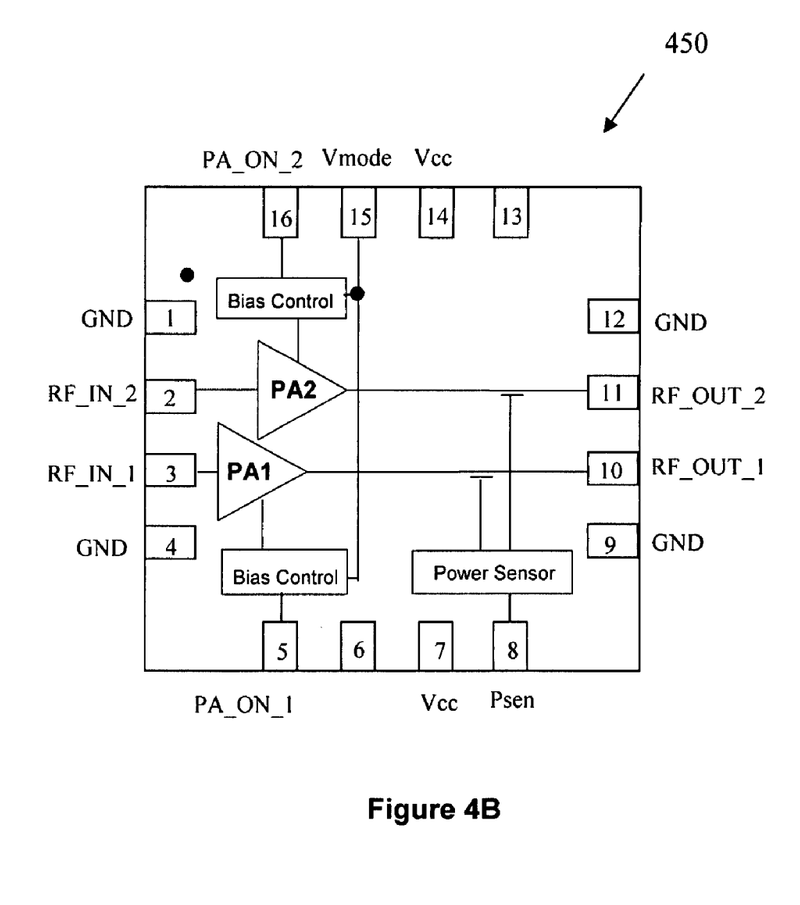
FIG. 4B illustrates the electrical schematics of a dual-band power amplifier module.

FIG. 4A and FIG. 4B respectively illustrate the electrical schematics of a single-band power amplifier module 400 and a dual-band power amplifier module 450. The single-band power amplifier module 400 comprises a power amplifier that can amplify wireless signal in a frequency band. The electrical terminals include "PA_ON" for receiving signals to turns power amplifier ON and OFF, "Psen" for power sensor output, and "Vmode" for mode control signal input. If more than one bit is used to control the PA, the control signal input can be either in serial or in parallel. If more than one bit in parallel is used, then the unassigned pin(s) on the module can be used as necessary. The dual-band power amplifier module 450 comprises two power amplifiers that can amplify wireless signals in at least two frequency bands. Each of the two power amplifiers is connected to similar electrical terminals as the single-band power amplifier module 400.

Figure 5:
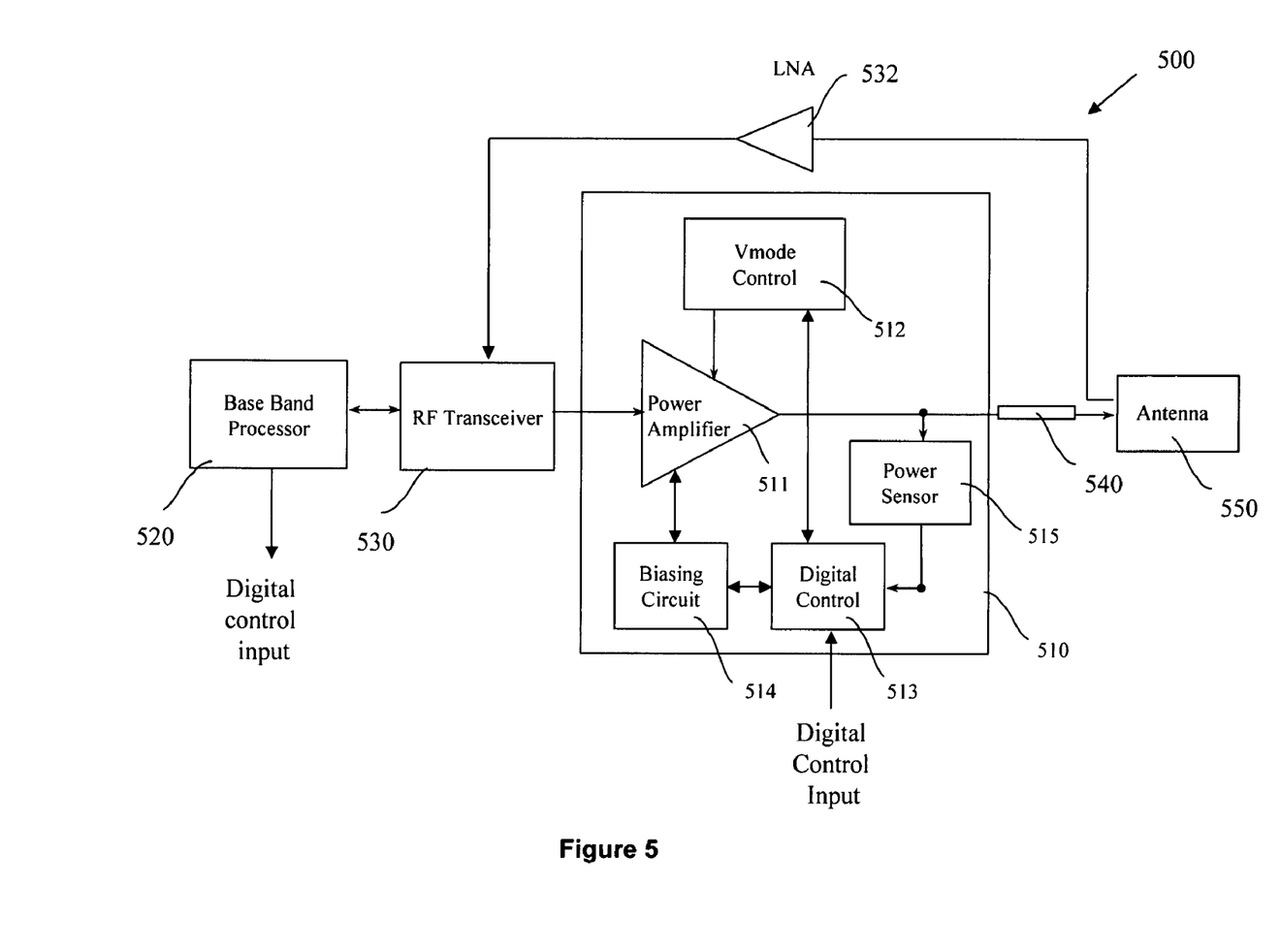
FIG. 5 illustrates a block diagram of a wireless communication device comprising a multi-protocol programmable power amplifier in accordance to the present invention.

The wireless communication device 500 includes a multi-mode programmable radio frequency (RF) power amplifier module 510, a base band processor 520, RF transceivers 530, and an impedance transmission line (or micro strip) 540, and an antenna 550. The base band processor 520 generates digitally modulated signals that are up-converted by the RF transceiver 530 to radio frequencies suitable for transmission. The RF signals are amplified by the RF power amplifier module 510 and subsequently transmission by the antenna 550. The multi-mode programmable radio frequency (RF) power amplifier module 510 is capable of responding to different communication and digital modulation standards.

In the reception path, the antenna 550 is capable of receiving wireless signals and converting them to radio frequency signals. The radio frequency signals can be amplified by a low-noise amplifier (LNA) 532 and sent to the RF transceiver 530. Optionally, the low-noise amplifier (LNA) 532 can reside within the RF transceiver 530. The transceiver 530 can down convert the radio signals to be processed buy the base band processor 520.

The RF power amplifier module 510 can be a unitary component that can be conveniently assembled in the wireless communication device 500. The RF power amplifier module 510 includes the power amplifier 511 and other circuitry and auxiliary electronic components integrated in the RF power amplifier module 510. In particular, a power amplifier 511 amplifies input radio-frequency signals and outputs amplified radio-frequency signals to the impedance transmission line 540. The power amplifier 511 can comprise one or a plurality of power transistors. The power transistors can be cascaded to provide desired gain factors, linearity and other characteristics. The output characteristics of the power amplifier 511 are dependent on the base currents and the power supply voltages of the one or more power transistors in the power amplifier 511.

A power sensing circuit 515 can detect the power of the amplified radio-frequency signals by, for example, capacitance coupling. The power sensing circuit 515 produces a power sensing signal that represents the output power of the amplified radio-frequency signals.

A digital control unit 513 can digitally control the biasing currents and the biasing voltages of the power transistors in the power amplifier 511. The digital control unit 513 can receive external input signals. The external input signals can be in serial or parallel. The external input signals can for example be provided by the base band processor 520. The digital control unit 513 can also receive the power-sensing signal from the power sensing circuit 515. In one arrangement, the digital control unit 513 can be replaced by the base band processor 520. In other words, the base band processor 520 can provide digital control functions to the power amplifier 511 in addition to its regular digital processing functions.

The digital control unit 513 controls the power amplifier 511 by sending Vmode control signals to a Vmode control circuit 512 and bias control signals to a biasing circuit 514. Vmode control circuit 512 controls the power supply voltage of the power transistors in response to Vmode control signals produced by digital control unit 513. The Vmode control can thus be dependent on the output power of the amplified radio-frequency signals via input to the digital control unit 513. The control over power supply voltage can affect the collector voltages that in turn can affect the biasing currents of the power transistors. For example, when the wireless communication device 500 is transmitting high power, the Vmode control circuit 512 can set the power transistors to operate at high current state to minimize output distortion. When the device needs to transmit low power, the Vmode control circuit 512 sets the power amplifier with low current to conserve battery life. The digital control unit 513 can be programmed to store 1 bit, 2 bits or more bits of data to control the power supply voltages of the power transistors to two, four, or more levels.

Similarly, the biasing circuit 514 can boost or reduce the biasing currents of the power transistors one or more stages in the power amplifier 511 in response to the bias control signals. The digital control unit 513 can set the power transistor to plurality of base current levels in response to output signals or other requirements by the wireless communication standards and protocols. The digital control unit 513 can be programmed to store 1 bit, 2 bits or more bits of data to control the biasing current or biasing voltage supply of the power amplifier to two, four, or more levels.

Figure 6A:
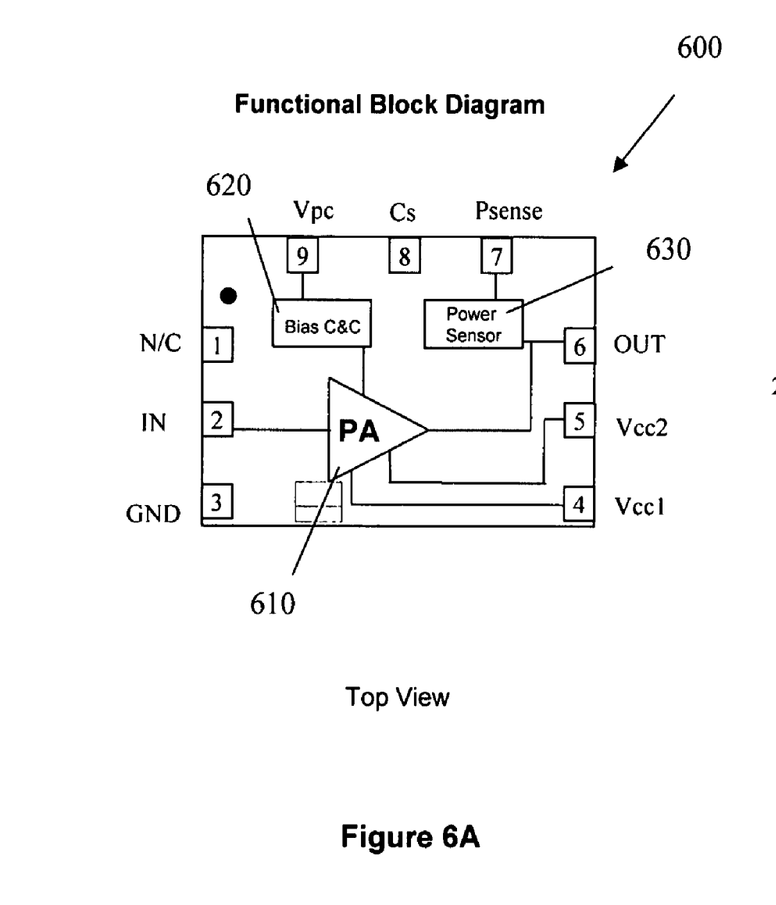
FIG. 6A shows the functional block diagram of a power amplifier module in a top view.
Figure 6B:
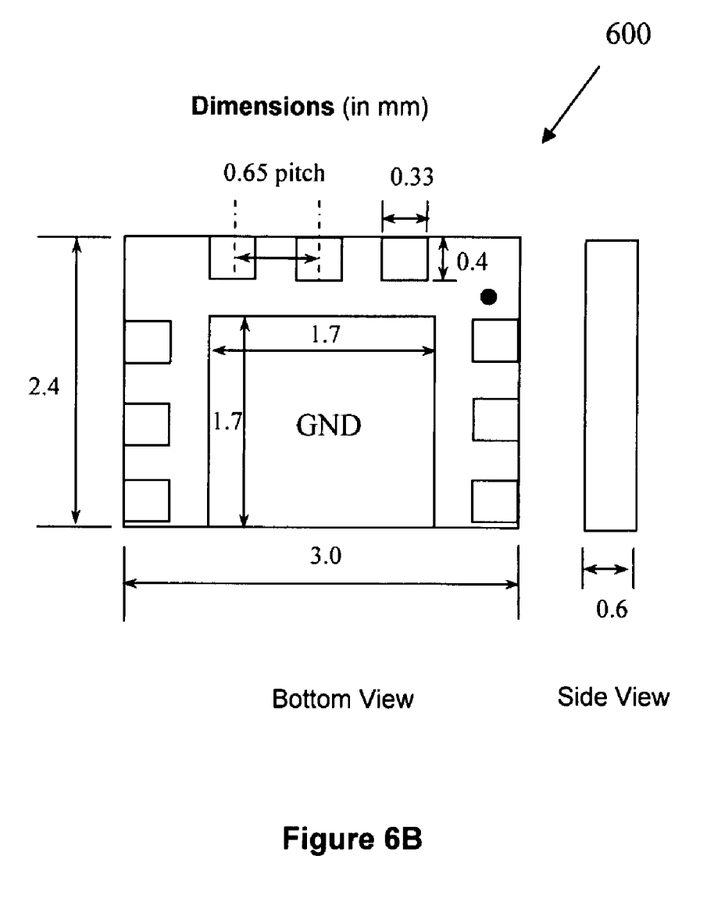
FIG. 6B shows the bottom view of the power amplifier module of FIG. 6A.

FIG. 6A shows the top view of a power amplifier module 600 including a functional block diagram of the power amplifier module 600. FIG. 6B shows the bottom view of the power amplifier module 600 including exemplary dimensions. The power amplifier module 600 is unitary device substantially in a rectangular shape defined by four sides. The power amplifier module 600 includes three electrical terminals (Pins 1-3) on the input side, three electrical terminals on the output side (Pins 4-6), and three electrical terminals (Pins 7-9) on the top side, as shown in FIG. 6A. No electrical terminals are disposed along the lower side in the power amplifier module 600.

The power amplifier module 600 is characterized by a substantially reduced dimensions comparing to prior art systems. The module is approximately 3.0 mm long, 2.4 mm wide, and only 0.6 mm thick as indicated in FIG. 6B.

The power amplifier module 600 includes a power amplifier 610 that can receive an input radio frequency signal from the input terminal IN (Pin 2) and produce an amplified radio frequency signal at the output terminal OUT (Pin 6). The power amplifier 610 receives power from power supply terminals Vcc1 (Pin 4) and Vcc2 (Pin 6). The power amplifier 610 is grounded at the ground terminal GND (Pin 3). A conductive grounding island is disposed in the center of the bottom side of the power amplifier module 600 to properly sink electric currents, shield electromagnetic interference, and dissipate heat produced in the power amplifier module 600.

Similar to the single-band power amplifier module 400, the biasing current and biasing voltage in the power amplifier 610 are controlled by a bias control circuit 620 that receives a bias control signal at bias control terminal Vpc (Pin 9). A power sensor circuit 630 detects the amplified radio frequency signal to produce a power sensing signal at the power sensing terminal Psense (Pin 7). The power sensing signal can be used to control the amplification operation of the power amplifier 610.

The power amplifier module 600 is a fully packaged power amplifier module that allows in situ testing with operation power supplies and amplification of radio frequency signals. The input impedance for the input radio frequency signal and the output impedance for the amplified radio frequency signals are both 50 ohm which are standards for receiving input radio frequency signals and outputting amplified radio frequency signals for testing. The power amplifier module 600 can therefore be fully tested as a standalone unit before it is assembled into a wireless communication device.

Figure 7:
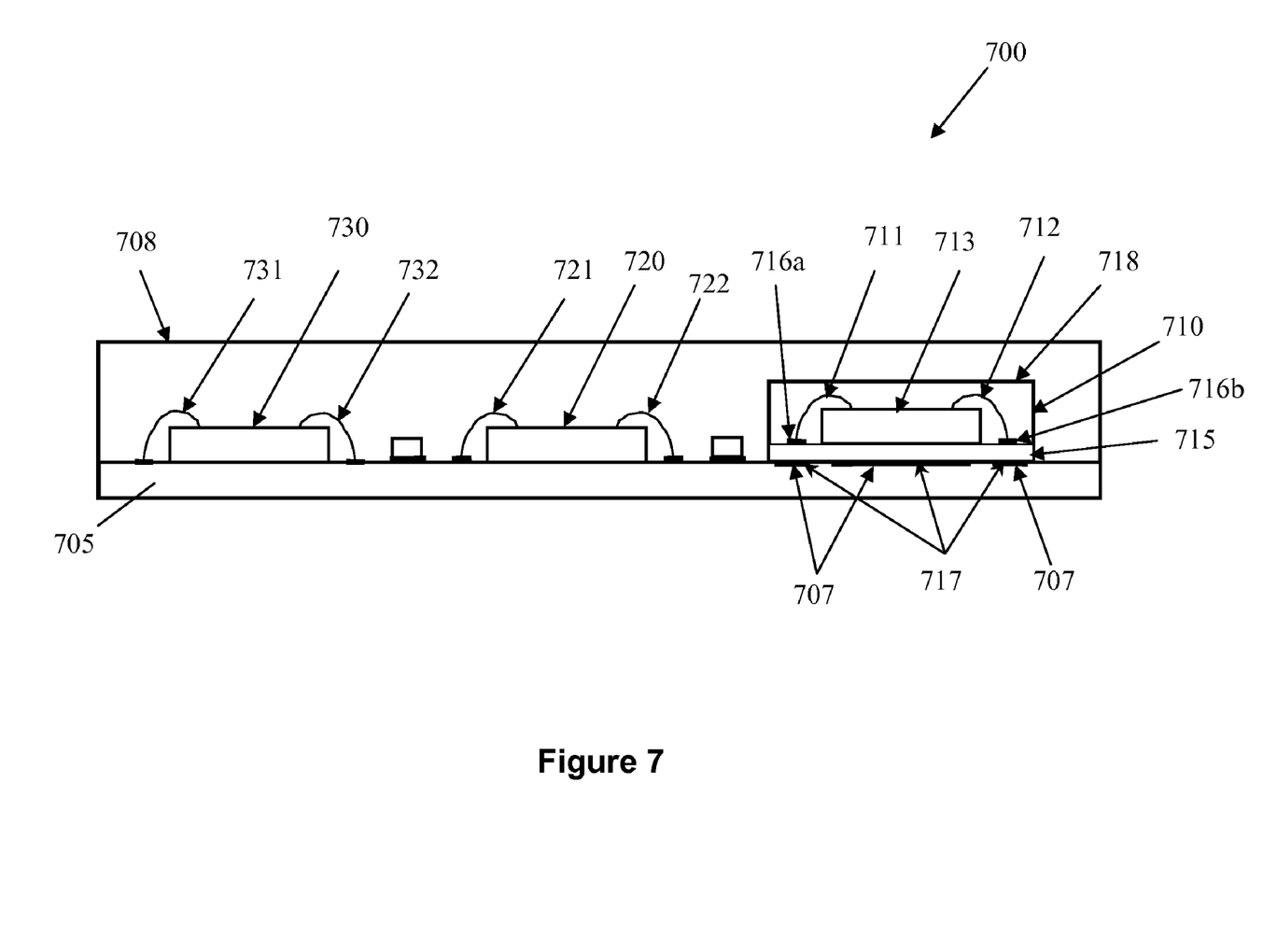
FIG. 7 illustrates a wireless communication device comprising a prepackaged power amplifier module and other electronic components in accordance with an embodiment of the present invention.

A wireless communication device 700 shown in FIG. 7 includes a substrate 705, a prepackaged power amplifier module 710, a radio frequency transceiver 720, and a base band digital signal processor 730. The prepackaged power amplifier module 710, a radio frequency transceiver 720, and a base band digital signal processor 730 are mounted on the substrate 705 and are enclosed by an enclosure 708 on the substrate 705. The radio frequency transceiver 720 can up-convert electric signals from the base band digital signal processor 730 to radio frequency signals to be amplified by the prepackaged power amplifier module 710. The wireless communication device 700 can further include an antenna and TX/RX switch that can transmit wireless signals in response to the amplified radio frequency signals.

The antenna coupled with the TX/RX switch can also receive wireless signals to convert them to radio frequency signals. The radio frequency transceiver 720 can down-convert the radio frequency signals to low frequency electric signals to be processed by the base band digital signal processor 730.

The radio frequency transceiver 720 and the base band digital signal processor 730 can be bare die chips that are mounted to the substrate 705. The radio frequency transceiver 720 and the base band digital signal processor 730 can be electrically connected to each other and other electronic components in wireless communication device 700 by bond wires 721, 722, 731, 732. The radio frequency transceiver 720 and the base band digital signal processor 730 may be tested on wafer before the assembling to the wireless communication device 700.

Figure 8:
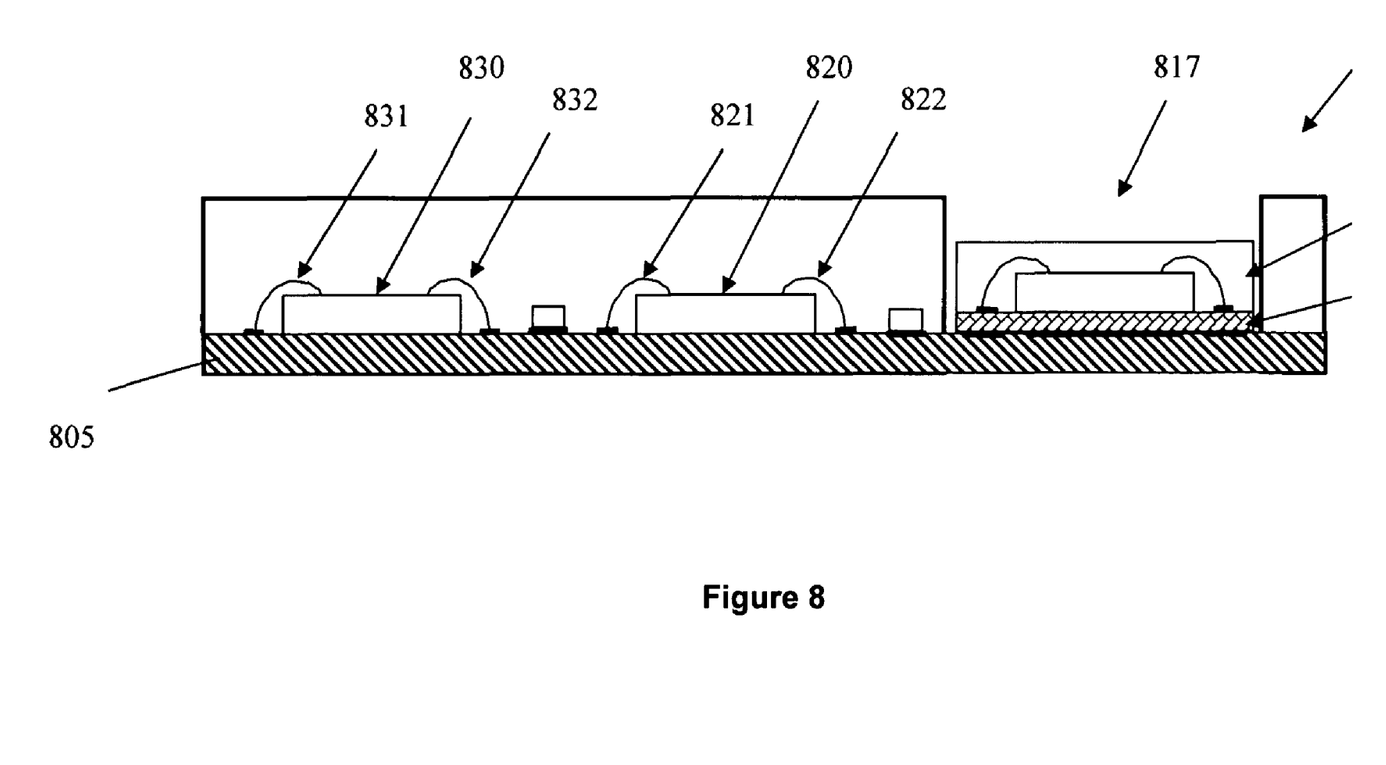
FIG. 8 illustrates a wireless communication device comprising a prepackaged power amplifier module and other electronic components in accordance with another embodiment of the present invention.

In another embodiment, FIG. 8 illustrates a wireless communication device 800 including a substrate 805, a prepackaged power amplifier module 810, a radio frequency transceiver 820, and a base band digital signal processor 830. The prepackaged power amplifier module 810, a radio frequency transceiver 820, and a base band digital signal processor 830 are mounted on the substrate 805. The radio frequency transceiver 820 can up-convert electric signals from the base band digital signal processor 830 to radio frequency signals to be amplified by the prepackaged power amplifier module 810. The wireless communication device 800 can further include an antenna and TX/RX switch that can transmit wireless signals in response to the amplified radio frequency signals.

The antenna coupled with the TX/RX switch can also receive wireless signals to convert them to radio frequency signals. The radio frequency transceiver 820 can down-convert the radio frequency signals to low frequency electric signals to be processed by the base band digital signal processor 830. The radio frequency transceiver 820 and the base band digital signal processor 830 can be bare die chips that are mounted to the substrate 805. The radio frequency transceiver 820 and the base band digital signal processor 830 can be electrically connected to each other and other electronic components in wireless communication device 800 by bond wires 821, 822, 831, 832. The radio frequency transceiver 820 and the base band digital signal processor 830 may be tested on wafer before the assembling to the wireless communication device 800.

An example of the prepackaged power amplifier modules 710 and 810 is the power amplifier module 600 shown in FIGS. 6A and 6B. An example of a functional diagram and components for the prepackaged power amplifier modules 710 and 810 is shown in FIG. 5.

The prepackaged power amplifier module 710 includes a substrate 715 that allows it to be integrated into the wireless communication device 700. The substrate 715 includes electric interconnects 716a, 716b to be connected with the terminals in the power amplifier chip 713. The substrate 715 can include a multiplayer printed circuit board (PCB), a lead frame, and lower-temperature co-fired ceramics (LTCC). The substrate 705 in the wireless communication device 700 includes electric interconnects 707 that match the electric interconnects 717 in the substrate 715 in the prepackaged power amplifier module 710. The prepackaged power amplifier module 710 can be plugged and readily bonded to the substrate 715. The power amplifier chip 713, the electric interconnects 716a, 716b, and wire bonding 711, 712 are enclosed by an enclosure 718 on the substrate 715.

The wireless communication device 700 is a packaged device that comprises a prepackaged power amplifier module 710. In the electronic technologies, the wireless communication device 700 can be categorized as Package in Package (PiP) or System in Package (SIP).

The prepackaged power amplifier module 710 includes all the proper electric terminals for in situ operation testing with radio frequency signals. The electric terminals 716a, 716b can be electrically connected by wire bonding 711, 712 to the electric contacts on the power amplifier chip (or die) 713 in the prepackaged power amplifier module 710. The prepackaged power amplifier module 710 can include impedance matching circuits for input and output RF signals with impedance at 50 ohm. The prepackaged power amplifier module 710 can also include electric terminals for power supply, biasing control, and power sensing.

Referring to FIG. 8, the wireless communication device 800 includes a window 817 that exposes the prepackaged power amplifier module 810 to the ambient environment. The exposure of the prepackaged power amplifier module 81 allows the prepackaged power amplifier module 810 to possess different thermal mechanical property and molding process characteristics from the other components in the wireless communication device 800. The window 817 also provides flexibility and convenience in the system packaging process.

Similar to the prepackaged power amplifier module 710 in FIG. 7, the prepackaged power amplifier module 810 includes a substrate 815 that allows it to be integrated into the wireless communication device 800. The substrate 815 includes electric interconnects with the terminals in the power amplifier. The substrate 815 can include a multiplayer printed circuit board (PCB), a lead frame, and lower-temperature co-fired ceramics (LTCC). The substrate 805 in the wireless communication device 800 includes electric interconnects that match the electric interconnects in the substrate 815 in the prepackaged power amplifier module 810. The prepackaged power amplifier module 810 can be plugged and readily bonded to the substrate 815.

The prepackaged power amplifier module 810 includes all the proper electric terminals for in situ operation testing with radio frequency signals. The electric terminals can be electrically connected by wire bonding to the electric contacts on the die in the prepackaged power amplifier module 810. The prepackaged power amplifier module 810 can include impedance matching circuits for input and output RF signals with impedance at 50 ohm. The prepackaged power amplifier module 810 can also include electric terminals for power supply, biasing control, and power sensing.

Before being packaged in the wireless communication device, the prepackaged power amplifier modules 710 and 810 are fully tested using RF signals in operating environments that respectively simulate the wireless communication devices 700 and 800. The non-operational prepackaged power amplifiers can be discarded. The testing can include all important performance characteristics of the power amplifiers: gain factors, frequency dynamic range, linearity, power efficiency etc. The testing is conducted in a test bed that can press electric pads into contact with the electric terminals of the prepackaged power amplifier modules 710 and 810 to supply power, biasing control signal and receive power sensing signal. The pressure electric contacts can also provide input radio frequency signals to the prepackaged power amplifier modules 710 and 810 and receive amplified radio frequency electric signals at 50 ohm I/O impedance from the prepackaged power amplifier modules 710 and 810. The electric terminals and the bond wire connections inside the prepackaged power amplifier modules 710 and 810 can remain intact throughout the testing process.

The prepackaged power amplifier modules determined to be non-functional are discarded. Only the fully tested and fully functional prepackaged power amplifiers 710 and 810 are respectively integrated in the wireless communication devices 700 and 800. The product loss due to non-operation tested power amplifier in the prior art wireless communication devices is therefore prevented.

The yield of the power amplifier is a significant factor in the overall system yield because of the stringent requirements of high power, frequency, linearity and power efficiency. A failure in the power amplifier integrated in the wireless communication device will result in the loss of all the components such as base band processor and transceiver in the wireless communication device.

In comparison, the conventional power amplifiers can only be tested on wafer using lower power voltage and non-RF signals rather than operation powers and radio frequency signals. The testing of the conventional power amplifiers is therefore limited and can often not detect problem amplifiers. Since the integration of a power amplifier module into a wireless communication device is usually irreversible, a failure of power amplifier discovered in the system test of the wireless communication devices is not repairable. The total wireless communication device has to be discarded.

In general, the system yield Ysys of the wireless communication devices 700 and 800 is the product of the yields $Y_{PA}$, $Y_2$, $Y_3$, $Y_4$, ... $Y_n$ of all the independent un-fully tested components:

$$Ysys = Y_{PA} \times Y_2 \times Y_3 \times Y_4 \times \ldots \times Y_n, \quad \text{(Equation 1)}$$

in which $Y_{PA}$ is the yield of the power amplifier. The non-fully tested components can include base band processor, the radio frequency transceiver, and the antenna. The in situ testing of the prepackaged power amplifier modules 710 and 810 prior to system integration and testing essentially increased $Y_{PA}$ to 100%. If $Y_{PA}$ for the non-fully tested power amplifier is 70%, the testing and quality control of the prepackaged power amplifier modules 710 and 810 in the present invention represents a factor of 1.43 (i.e. 100%/70%) increase in the system yield Ysys.

The wireless communication devices 700 and 800 are compatible with amplifying radio frequency signals in a plurality of frequency bands. The prepackaged power amplifier modules 710 and 810 can comprise a plurality of power amplifiers each amplifying radio-frequency signals in different frequency bands. For example, the first power amplifier can amplify radio frequency signals in a frequency band centered around 2.5 GHz. A second power amplifier can amplify radio frequency signals in a frequency band centered around 3.5 GHz. Other radio frequencies can include 700 MHz, 800 MHz, 900 MHz, 1800 MHz, 1900 MHz, 2 GHz, 2.5 GHz, 3 GHz, 5 GHz, etc. In general, the first and the second power amplifiers can amplify radio frequency signals in the frequency range of 100 MHz to 10 GHz. signals Details of power amplification for a plurality frequency bands are disclosed in U.S. patent application Ser. No. 11/039,687, titled "Multiband power amplifier module for wireless communications" by Ichitsubo et al, filed Jan. 19, 2005, the disclosure of which is hereby incorporated by reference.

The prepackaged power amplifier modules 600, 710, and 810 can further comprise frequency filter circuits and diplexers that can receive the input radio frequency signals and output a radio frequency signal at a selective frequency (e.g. one of 2.5 GHz and 3.5 GHz). The capability of dynamic bias setting in power amplifier module 510 can reduce crosstalk between adjacent channels and improves Adjacent Channel Power Ratio (ACPR). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004, the disclosures of which are hereby incorporated by reference.

Details of the operations of the bias control circuits and power sensing circuit as well as the design and benefits of the electric grounding in wireless power amplifier modules are disclosed in the commonly assigned and the above mentioned U.S. patent application Ser. No. 10/041,863, titled "Multi-layer RF Amplifier Module" by Wang, et al., filed Oct. 22, 2001, U.S. patent application Ser. No. 10/385,058, titled "Power amplifier Module for wireless communication devices" by Ichitsubo et al, filed Mar. 9, 2003, U.S. patent application Ser. No. 10/385,059, titled "Accurate Power Sensing Circuit for Power Amplifiers by Ichitsubo et al, filed Mar. 9, 2003, and U.S. patent application Ser. No. 10/804,737, titled "RF front-end module for wireless communication devices" by Ichitsubo et al., filed Mar. 18, 2004. The disclosures of these applications are incorporated herein by reference.

With the smaller foot print and thinner thickness compared to prior art implementations, the prepackaged amplifier modules 600, 710, and 810 are ideal for miniaturized device applications. The wireless communication devices 300, 500 and 700 can be a cellular phone, mobile computers, handheld wireless digital devices, a WLAN adaptor, and other wireless electronic devices. The wireless communication devices 300, 500 and 700 can be compatible with cellular wireless communication standards such as 2G, 2.5G and 3G including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., Wi-Fi wireless communication standards such as IEEE 802.11, and Wi-Max wireless communication standards such as IEEE 806.12, and others.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. The following claims are intended to encompass all such modifications.

What is claimed is:

1. A system-in-package wireless communication device, comprising:
   a system-in-package substrate;
   a transceiver mounted on the system-in-package substrate and configured to convert an input electric signal to a radio frequency signal;
   a system-in-package enclosure configured to encapsulate at least the transceiver and part of the system-in-package substrate, wherein the system-in-package enclosure comprises a window;
   a prepackaged power amplifier module mounted on the system-in-package substrate and under the window in the system-in-package enclosure, the prepackaged power amplifier module comprising:
      a single-die substrate mounted on the system-in-package substrate;
      a power amplifier die on the single-die substrate, the power amplifier die comprising a power amplifier circuit configured to produce an amplified radio frequency signal in response to the radio frequency signal and a power sensing circuit configured to detect the amplified radio frequency signal and to output a power sensing signal; and
      a prepackage enclosure configured to encapsulate the power amplifier die on the single-die substrate, wherein the prepackage enclosure is exposed to the ambient environment through the window in the system-in-package enclosure; and
   a base band processor mounted on the system-in-package substrate, wherein the base band processor is connected with the power sensing circuit and is configured to receive a power sensing signal from the power sensing circuit, the base band processor being configured to send the input electric signal to the transceiver.

2. The system-in-package wireless communication device of claim 1, wherein the prepackage enclosure is fully exposed to the ambient environment through the window in the system-in-package enclosure.

3. The system-in-package wireless communication device of claim 1, wherein the prepackaged power amplifier module is encapsulated inside the system-in-package enclosure.

4. The system-in-package wireless communication device of claim 1, wherein the system-in-package substrate comprises first electric interconnects configured to be electrically coupled to the power amplifier circuit.

5. The system-in-package wireless communication device of claim 4, wherein the single-die comprises second electric interconnects that are electrically coupled to the power amplifier circuit.

6. The system-in-package wireless communication device of claim 5, wherein the second electric interconnects are configured to be electrically connected to the first electric interconnects when the single-die is mounted onto the system-in-package substrate.

7. The system-in-package wireless communication device of claim 4, wherein the prepackaged power amplifier module comprises wire bonds configured to electrically connect the power amplifier circuit to the second electric interconnects in the single-die.

8. The system-in-package wireless communication device of claim 7, wherein the second electric interconnects are positioned on a first surface of the single-die, wherein a second surface of the single-die opposing to the first surface is in contact of the system-in-package substrate when the single-die is mounted onto the system-in-package substrate.

9. The system-in-package wireless communication device of claim 1, wherein the prepackaged power amplifier module has been tested to be capable of amplifying radio-frequency signals before the prepackaged power amplifier module is mounted onto the system-in-package substrate.

10. The system-in-package wireless communication device of claim 1, further comprising a digital control unit in the prepackaged power amplifier module and configured to produce a bias control signal to be received by the power amplifier circuit.

11. The system-in-package wireless communication device of claim 1, wherein the prepackaged power amplifier module further comprises:
   a bias control terminal configured to receive a bias control signal;
   an input terminal configured to receive the input radio frequency signal;
   a ground terminal electrically connected to the ground of the power amplifier circuit, wherein the input terminal and the ground terminal are disposed on the same side of the power amplifier die;
   an output terminal configured to output the amplified radio frequency signal; and
   one or more power supply terminals configured to receive power to be supplied to the power amplifier circuit.

12. The system-in-package wireless communication device of claim 1, wherein the prepackaged power amplifier module further comprises a power sensing terminal configured to output the power sensing signal to be received by the base band processor on the system-in-package substrate.

13. The system-in-package wireless communication device of claim 1, wherein the prepackaged power amplifier module is substantially rectangular shaped, wherein the prepackaged power amplifier module further comprises nine electric terminals positioned along three sides of the power amplifier die, wherein the nine electric terminals are configured to receive power and the radio frequency signal and to output the amplified radio frequency signal, and wherein a fourth side of the power amplifier die does not comprise an electric terminal.

14. The system-in-package wireless communication device of claim 1, wherein the prepackaged power amplifier module is substantially rectangular shaped, wherein the prepackaged power amplifier module further comprises a power supply terminal and an output terminal positioned along a same side of the power amplifier die, wherein the power supply terminal is configured to receive power for the power amplifier circuit, wherein the output terminal is configured to output the amplified radio frequency signal.

15. The system-in-package wireless communication device of claim 1, wherein the prepackaged power amplifier module comprises an impedance matching circuit configured to receive the input radio frequency signal.

16. A system-in-package wireless communication device, comprising:
   a system-in-package substrate comprising first electric interconnects;
   a transceiver mounted on the system-in-package substrate and configured to convert an input electric signal to a radio frequency signal;
   a prepackaged power amplifier module mounted on the system-in-package substrate, wherein the prepackaged power amplifier module comprises:
      a single-die substrate mounted on the system-in-package substrate, wherein the single-die substrate comprises second electric interconnects on a top surface of the single-die substrate, wherein the single-die substrate comprises a plurality of pads on a bottom surface of the single-die substrate and a conductive grounding island in the center of the bottom surface of the single-die substrate; and a power amplifier die on the single-die substrate, the power amplifier die comprising a power amplifier circuit electrically coupled to the second electric interconnects by wire bonding and a power sensing circuit configured to detect the amplified radio frequency signal and to output a power sensing signal, wherein the power amplifier circuit is configured to produce an amplified radio frequency signal in response to the radio frequency signal, wherein the second electric interconnects are configured to be electrically connected to the first electric interconnects when the single-die substrate is mounted onto the system-in-package substrate;

a system-in-package enclosure configured to encapsulate at least the transceiver on the system-in-package substrate, wherein the system-in-package enclosure comprises a window configured to expose the prepackaged power amplifier module to the ambient environment; and a base band processor mounted on the system-in-package substrate, the base band processor being configured to send the input electric signal to the transceiver.

17. The system-in-package wireless communication device of claim 16, wherein the second electric interconnects are positioned on a first surface of the single-die substrate, wherein a second surface of the single-die substrate opposing to the first surface is in contact of the system-in-package substrate when the single-die substrate is mounted onto the system-in-package substrate.

18. The system-in-package wireless communication device of claim 16, wherein the power amplifier die in the prepackaged power amplifier module comprises an impedance matching circuit configured to receive the input radio frequency signal.

19. The system-in-package wireless communication device of claim 16, wherein the prepackaged power amplifier module is substantially rectangular shaped, wherein the prepackaged power amplifier module further comprises nine electric terminals positioned along three sides of the power amplifier die, and wherein a fourth side of the power amplifier die does not comprise an electric terminal.

20. The system-in-package wireless communication device of claim 16, wherein the prepackaged power amplifier module is substantially rectangular shaped, wherein the prepackaged power amplifier module further comprises a power supply terminal and an output terminal positioned along a same side of the power amplifier die, wherein the power supply terminal is configured to receive power for the power amplifier circuit, wherein the output terminal is configured to output the amplified radio frequency signal.

21. The system-in-package wireless communication device of claim 16, wherein the prepackaged power amplifier module is substantially rectangular shaped, wherein the prepackaged power amplifier module further comprises an input terminal and a ground terminal positioned along a same side of the power amplifier die, wherein the input terminal is configured to receive the radio frequency signal.

22. The system-in-package wireless communication device of claim 16, wherein the prepackaged power amplifier module comprises an electrical terminal configured to receive power, the radio frequency signal, or a control signal, or to output the amplified radio frequency signal.

23. The system-in-package wireless communication device of claim 16, wherein the prepackaged power amplifier module further comprises a prepackage enclosure configured to encapsulate the power amplifier die.

24. A system-in-package wireless communication device, comprising:

a system-in-package substrate comprising first electric interconnects;

a transceiver mounted on the system-in-package substrate and configured to convert an input electric signal to a radio frequency signal;

a base band processor mounted on the system-in-package substrate, the base band processor being configured to send the input electric signal to the transceiver;

a system-in-package enclosure configured to encapsulate at least the transceiver on the system-in-package substrate, wherein the system-in-package enclosure comprises a window configured to expose the prepackaged power amplifier module to the ambient environment; and a prepackaged power amplifier module mounted on the system-in-package substrate, wherein the prepackaged power amplifier module comprises:

a single-die substrate comprising second electric interconnects and mounted on the system-in-package substrate on a top surface of the single-die substrate, wherein the single-die substrate comprises a plurality of pads on the center of a bottom surface of the single-die substrate and a conductive grounding island in the center of the bottom surface of the single-die substrate;

a power amplifier die on the single-die substrate, wherein the power amplifier die is substantially rectangular shaped and comprises a power amplifier circuit that is electrically coupled to the second electric interconnects and is configured to produce an amplified radio frequency signal in response to the radio frequency signal, wherein the power amplifier die comprises a power sensing circuit configured to detect the amplified radio frequency signal and to output the power sensing signal, wherein the second electric interconnects are configured to be electrically connected to the first electric interconnects when the single-die substrate is mounted onto the system-in-package substrate wherein the conductive grounding island on a bottom surface of the single-die substrate is positioned underneath the power amplifier die; and a prepackage enclosure configured to encapsulate the power amplifier die on the single-die substrate.

* * * * *